United States Patent [19]

Lacey et al.

[11] Patent Number: 5,381,370
[45] Date of Patent: Jan. 10, 1995

[54] MEMORY WITH MINIMIZED REDUNDANCY ACCESS DELAY

[75] Inventors: Timothy M. Lacey, Cupertino; Christopher S. Norris, Sunnyvale, both of Calif.

[73] Assignee: Cypress Semiconductor Corporation, San Jose, Calif.

[21] Appl. No.: 111,164

[22] Filed: Aug. 24, 1993

[51] Int. Cl.[6] .......................... G11C 7/00; G11C 8/00
[52] U.S. Cl. ............................ 365/200; 365/189.07; 365/230.06
[58] Field of Search ............... 365/200, 189.07, 230.06

[56] References Cited

U.S. PATENT DOCUMENTS

| | | | |
|---|---|---|---|
| 4,807,191 | 2/1989 | Flannagan | 365/189 |
| 5,031,142 | 7/1991 | Castro | 365/49 |
| 5,083,294 | 1/1992 | Okajima | 365/200 |
| 5,233,559 | 8/1993 | Brennan, Jr. | 365/200 |
| 5,267,205 | 11/1993 | Hamada | 365/200 |

OTHER PUBLICATIONS

-B. F. Fitzgerald and D. W. Kemerer, "Memory System with High-Performance Word Redundancy," IBM Technical Disclosure Bulletin, vol. 19, No. 5, pp. 1638-1639 (Oct. 1976).

*Primary Examiner*—Eugene R. LaRoche
*Assistant Examiner*—Do Hyun Yoo
*Attorney, Agent, or Firm*—Blakely, Sokoloff, Taylor & Zafman

[57] ABSTRACT

A memory is described that includes a main memory array having a plurality of main memory locations and a redundant memory array having a plurality of redundant memory locations. A main decoding circuit is coupled to the main memory array for decoding an address received from an external circuit to access a selected one of the plurality of main memory locations. A storage circuit is provided for pre-storing the address of the selected one of the plurality of main memory locations when the selected one of the plurality of main memory locations is defective. A redundant comparison circuit is coupled to the redundant memory array and the storage circuit for comparing the external address with the address stored in the storage circuit in order to access a selected one of the plurality of redundant memory locations. A static decoding circuit is coupled to the storage circuit and the main select circuit for decoding the address received from the storage circuit and for disabling the main select circuit from accessing the selected one of the plurality of main memory locations such that when the redundant comparison circuit accesses the selected one of the plurality of redundant memory locations, the main select circuit has already been disabled from accessing the selected one of the plurality of main memory locations.

16 Claims, 5 Drawing Sheets

MEMORY WITH MINIMIZED REDUNDANCY ACCESS DELAY

FIELD OF THE INVENTION

The present invention pertains to the field of computer memories. More particularly, this invention relates to a memory with minimized redundancy access delay, wherein the defective memory elements of the memory can be disabled without speed penalty for the access to the corresponding redundant memory elements.

BACKGROUND OF THE INVENTION

One type of prior art non-volatile computer memory is the Erasable Programmable Read-Only Memory ("EPROM"). The EPROM can be programmed by a user. Once programmed, the EPROM retains its data until erased. Ultraviolet light erasure of the EPROM erases the entire contents of the memory array. The memory array may then be reprogrammed with new data.

The prior EPROM typically includes a decoding circuit to address the memory array of the device. The decoding circuit receives addresses from address input pins of the EPROM. Data stored in the EPROM at the applied address can then be read via the output pins of the EPROM.

The prior EPROM also typically includes redundant memory cells. The redundant memory cells are used to replace defective cells of the main memory array. The redundant memory cells are also arranged into rows and columns and are therefore referred to as redundant memory array. When a memory cell in a column or row of the main memory array is found defective, a redundant column or row of the redundant memory array is used to replace the defective column or row in the main memory array.

In order to replace a defective memory column or row in the main memory array with a redundant memory column or row, the defective column or row needs to be disconnected from being accessed when addressed. FIG. 1 illustrates one prior art scheme of disconnecting the defective column or row in the main memory array.

As can be seen from FIG. 1, each of the memory elements (i.e., memory row or column) of main memory array 11 of EPROM 10 is connected to a main select circuit 13 via one of fuse elements 17 through 18n. When one memory element in main memory array 11 is found defective, its associated one of fuse elements 17–18n will be blown with a laser beam such that the access to the defective memory element in main memory array 11 is disabled. For example, when the memory element that is connected to fuse element 17 is found defective, fuse element 17 will then be blown to disable the access to that defective memory element from main decoder 15 and main select circuit 13.

Disadvantages are, however, associated with this prior an scheme. One disadvantage is that the fuse elements typically require relatively large die space in the EPROM. This is due to the laser alignment requirements. In addition, the use of laser beam to blow the fuse elements typically causes the fabrication cost of the prior EPROM to increase significantly. Moreover, the fuse elements typically introduce parasitic resistance in the access path of the memory cells.

A prior solution to solving this problem is to dynamically disable the main decoder or the main select circuit for the main memory array whenever the defective memory element is addressed. FIG. 2 illustrates one such prior scheme of dynamically disabling the main select circuit whenever the defective memory element of the main memory array is addressed.

As can be seen from FIG. 2, prior EPROM 20 includes a main decoder 25, a main select circuit 23, and a main memory array 21. Prior EPROM 20 also includes a redundant memory array 22, a redundant select circuit 24, and a redundant decoder 26. Redundant decoder 26 includes in addition to other circuitry, a number of storage circuits 26a through 26n, each being used to activate one redundant element of redundant memory array 22 to replace a defective memory element of main memory array 21. Each of storage circuits 26a–26n includes (1) a number of nonvolatile storage elements to store an address of a defective memory element of main memory array 21 and (2) a comparator for comparing the external addresses applied with the address stored in the nonvolatile storage elements of that storage circuit.

When a defective memory element in main memory array 21 is discovered, a redundant memory element is activated to replace the defective memory element. This is done by storing the address of the defective memory element in the nonvolatile storage elements of a storage circuit associated with that redundant memory element. A comparison with the stored address is made every time EPROM 20 is addressed to determine whether the defective memory element is addressed. If so, the comparator generates an enable/disable signal to cause redundant select circuit 24 to activate the associated redundant memory element. In addition, the enable/disable signal is also applied to main select circuit 23 to disable the entire main select circuit. Main select circuit 23 includes an AND gate for each of the memory elements of main memory array 21 and a NOR gate 29 coupled to receive the enable/disable signal from each of storage circuits 26a–26n. When any one of storage circuits 26a–26n generates the enable/disable signal, the entire circuit of main select circuit 23 is disabled from accessing main memory array 21.

One disadvantage of this prior scheme is the slower access to the EPROM when a defective memory element is addressed. This is due to the fact that the access to redundant memory array 22 has to wait until the entire circuit of main select circuit 23 is disabled. This typically requires NOR gate 29 to have relatively large driving capability in order to disable the entire circuit of main select circuit 23. The larger the driving capability the NOR gate is required to have, the slower the circuit is. In addition, the relatively large driving ability of NOR gate 29 also requires the NOR gate to be made large, thus occupying relatively large die space within the prior EPROM.

SUMMARY AND OBJECTS OF THE INVENTION

One of the objects of the present invention is to provide a memory that is cost effective in activating redundant memory elements in place of defective memory elements in the memory.

Another object of the present invention is to provide a memory that allows the individual defective memory elements in the memory array of the memory to be constantly and statically disabled.

A further object of the present invention is to provide a memory that causes its defective memory elements to have been constantly and statically disabled when the corresponding redundant memory elements are accessed.

Another object of the present invention is to provide a memory that allows its redundant memory elements to be accessed without speed penalty.

A memory is described that comprises a main memory array having a plurality of main memory locations and a redundant memory array having a plurality of redundant memory locations. A main select circuit is coupled to the main memory array for decoding an address received from an external circuit to access a selected one of the plurality of main memory locations. A storage circuit is provided for pre-storing the address of the selected one of the plurality of main memory locations when the selected one of the plurality of main memory locations is defective. A redundant comparison circuit is coupled to a redundant select circuit for the redundant memory array and the storage circuit for comparing the address from the external circuit with the address stored in the storage circuit in order to access a selected one of the plurality of redundant memory locations. A static decoding circuit is coupled to the storage circuit and the main select circuit for decoding the address received from the storage circuit and for statically disabling the main select circuit from accessing the selected one of the plurality of main memory locations such that when the redundant select circuit accesses the selected one of the plurality of redundant memory locations, the main select circuit has already been disabled from accessing the selected one of the plurality of main memory locations.

A memory comprises a main memory array having a plurality of main memory locations and a redundant memory array having a plurality of redundant memory locations. A main select circuit is coupled to the main memory array for selecting and accessing a selected one of the plurality of main memory locations in the main memory array. A main decoding circuit is coupled to the main select circuit for decoding an address received from an external circuit to cause the main select circuit to access the selected one of the plurality of main memory locations. A redundant select circuit is coupled to the redundant memory array for selecting and accessing a selected one of the plurality of redundant memory locations in the redundant memory array. A storage circuit is provided for pre-storing the address of the selected one of the plurality of main memory locations when the selected one of the plurality of memory locations is defective. A static decoding and disabling circuit is coupled to the storage circuit and the main select circuit for decoding the address pre-stored in the storage circuit to disable the main select circuit from accessing the selected one of the plurality of main memory locations before the main decoding circuit receives the address from the external circuit. The static decoding and disabling circuit statically disables the main select circuit from accessing the selected one of the plurality of main memory locations as soon as the address for the selected one of the plurality of memory locations is stored in the storage circuit. A redundant comparison circuit is coupled to the storage circuit and the redundant select circuit for comparing the address received from the storage circuit with that from the external circuit and for enabling the redundant select circuit to access the selected one of the plurality of redundant memory location when the two addresses match. When the redundant comparison circuit causes the redundant select circuit to access the selected one of the plurality of redundant memory locations, the main select circuit has already been disabled from accessing the selected one of the plurality of main memory locations.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
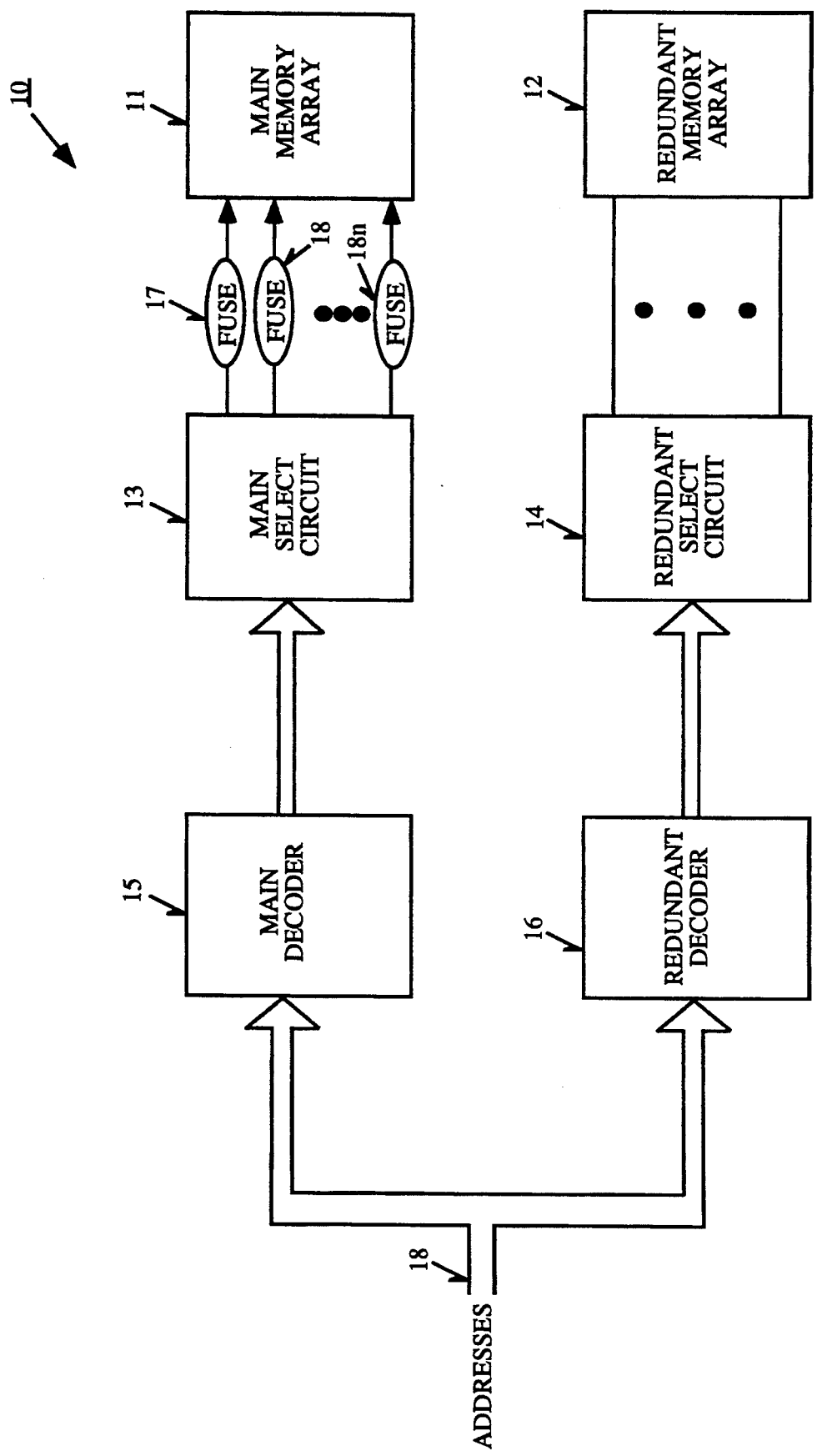
FIG. 1 is a block diagram of a prior art scheme of disconnecting defective memory elements in a memory array.
Figure 2:
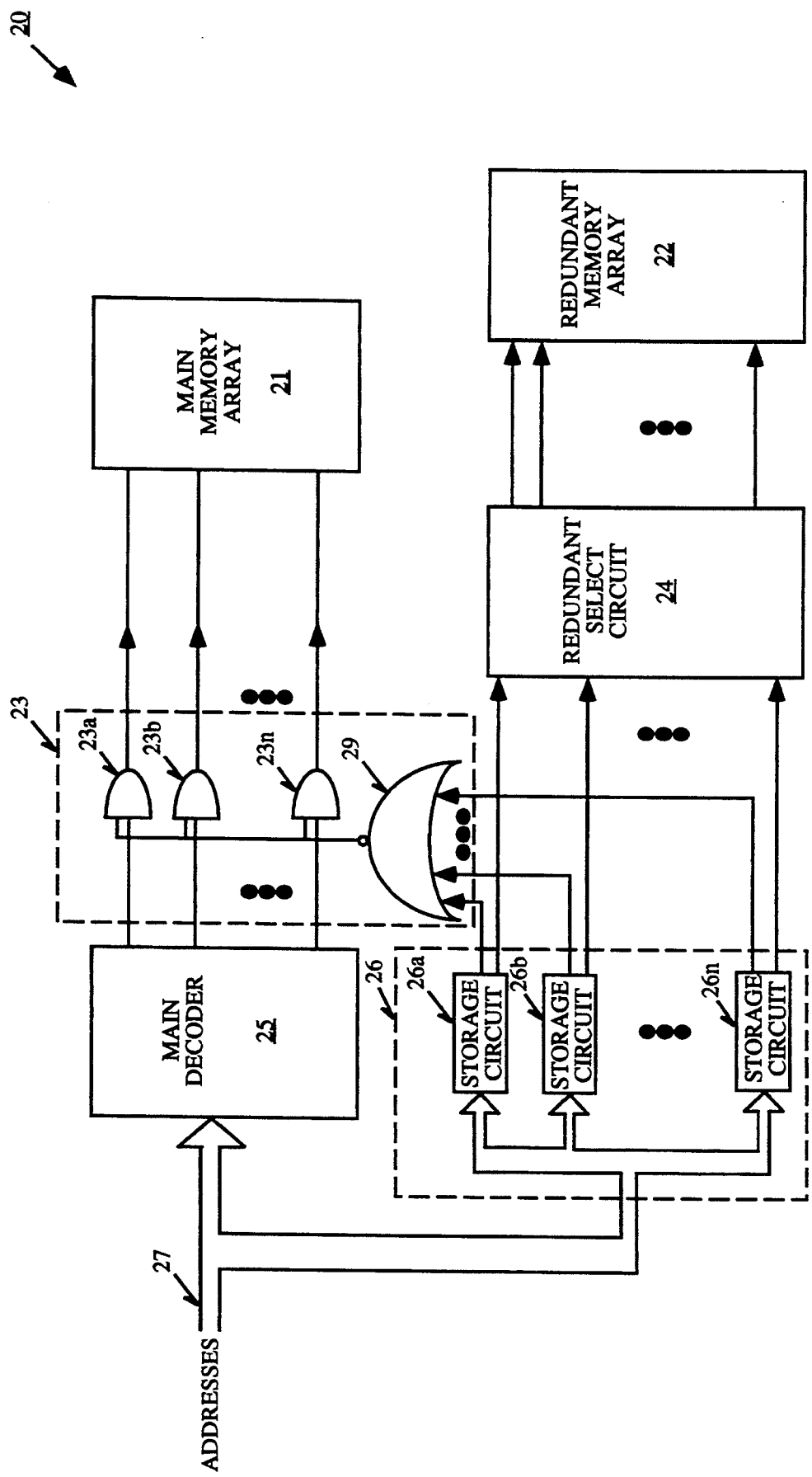
FIG. 2 is a block diagram of another prior art scheme of dynamically disabling defective memory elements in a memory array.
Figure 3:
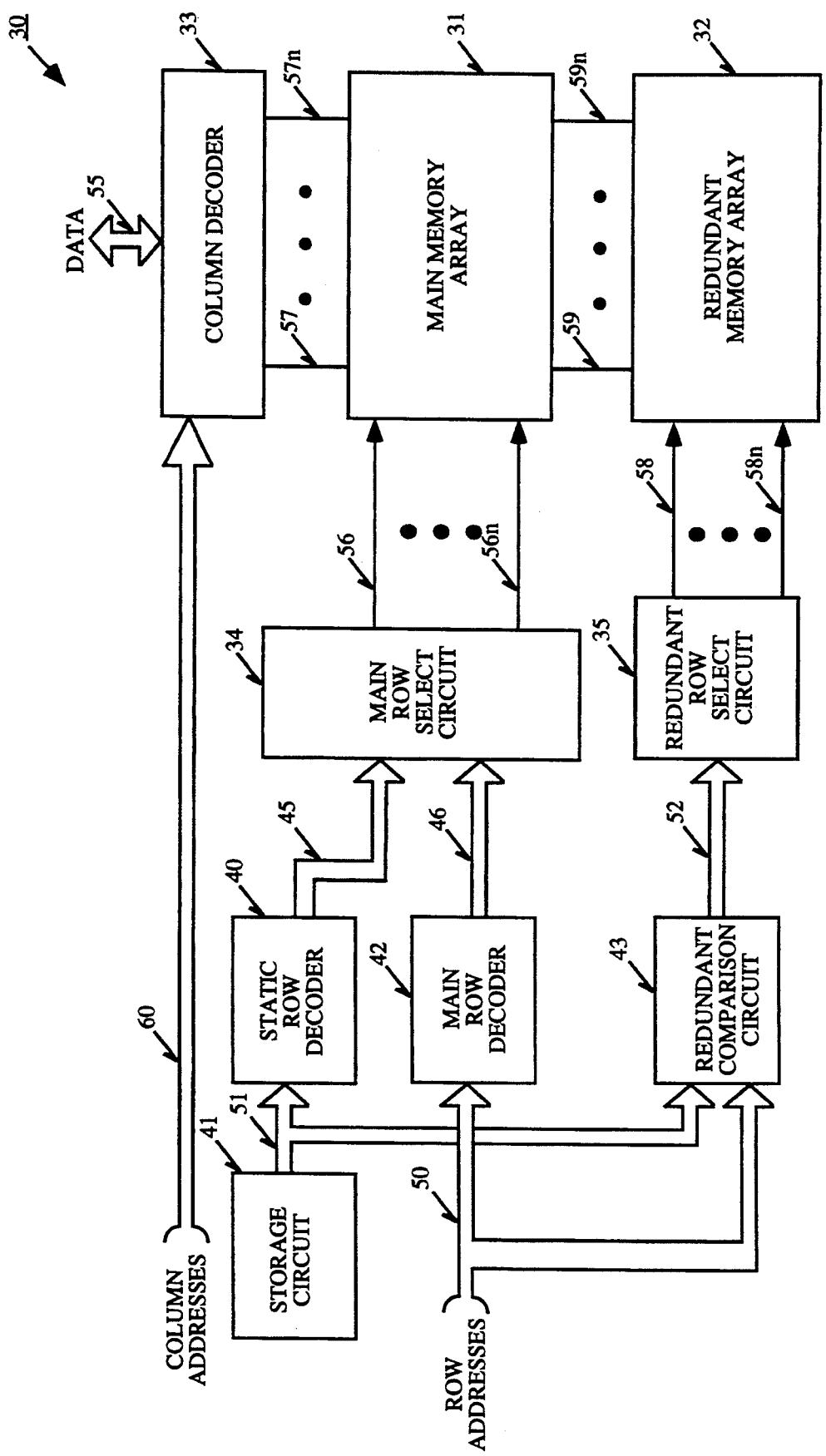
FIG. 3 is a block diagram of an EPROM which implements an embodiment of the present invention.

FIG. 3 illustrates in block diagram form the circuitry of an EPROM 30 that implements a preferred embodiment of the present invention. EPROM 30 includes a main memory array 31 that is made up of memory cells that store data at addresses. In one embodiment, main memory array 31 can store 1 Mbits ("megabits") of data. In alternative embodiments, main memory array 31 can be smaller or larger.

In one embodiment, all the circuit of EPROM 30 shown in FIG. 3 resides on a single substrate and employs MOS circuitry.

The memory embodied by EPROM 30 can be used in any kind of computer systems or data processing systems. The memory can be of types other than EPROM. For example, the memory can be a flash Erasable and Programmable Read-Only Memory ("flash EPROM"). As a further example, the memory can be a Random Access Memory ("RAM").

In one embodiment, each of the memory cells in main memory array 31 of EPROM 30 stores a single bit of data at one time. In another embodiment, each of the memory cells in main memory array 31 stores multiple bits of data at one time.

Main memory array 31 is organized into row and columns. Memory cells are placed at intersections of rows 56 through 56n and columns 57 through 57n. Each of rows 56 through 56n is connected to the control gate of a number of memory cells in one row. Each of columns 57–57n is connected to the drain of a number of memory cells in one column.

EPROM 30 includes a redundant memory array 32. Redundant memory array 32 is used to replace defective memory cells in main memory array 31. Redundant memory array 32 is also organized into rows and columns. Similar to main memory array 31, redundant memory array 32 has redundant memory cells placed at intersections of rows 58 through 58n and columns 59 through 59n. Each of rows 58–58n is connected to the control gate of a number of redundant memory cells in one row of redundant memory array 32. Each of columns 59–59n is connected to the drain of a number redundant memory cells in one column of redundant memory array 32. Each row in redundant memory array 32 is hereinafter referred to as a redundant row and each column of redundant memory array 32 is hereinafter referred to as a redundant column.

As can be seen from FIG. 3, each of columns 59–59n for redundant memory array 32 is connected to its corresponding one of columns 57–57n for main memory array 31. For this embodiment, only a separate row decoder is required for redundant memory array 32. Therefore, when one of columns 57–57n is selected, the associated one of columns 59–59n is also selected. For this embodiment, a redundant row of redundant memory array 32 can replace a defective row in main memory array 31. When replacing a defective row in main memory array 31, the redundant row is accessed whenever the defective row is addressed. In other words, when the defective row of main memory array 31 is addressed for read and programming operations, the associative redundant row of redundant memory array 32 is accessed for such operations.

For another embodiment, the positions of columns 57–57n and 59–59n are swapped with rows 56–56n and 58–58n such that each of rows 56–56n is connected to its associated one of rows 58–58n. For this embodiment, a separate column decoder is required for redundant memory array 32. For this embodiment, each redundant column of redundant memory array 32 can replace one defective column in main memory array 31.

For a further embodiment, rows 58–58n and columns 59–59n of redundant memory array 32 are not connected to the respective rows 56–56n and columns 57–57n. For this embodiment, separate row and column decoders are needed for redundant memory array 32 and a multiplexer will be used to selectively apply data to or from one of memory arrays 31–32. Because memory arrays 31 and 32 are not connected to each other in this embodiment, a redundant row of redundant memory array 32 can be used to replace a defective row of main memory array 31 and a redundant column of redundant memory array 32 can be used to replace a defective column of main memory array 31. The implementation of the present invention can be applied to any of the above-described memory arrangements. For the illustration purpose only, the scheme of the present invention will be described in more detail below, in conjunction with the first memory arrangement described above and shown in FIG. 3.

EPROM 30 also includes a main row decoder 42 and a column decoder 33. Main row decoder 42 is the row decoder for main memory array 31. Main row decoder 42 is coupled to rows 56–56n of main memory array 31 via a main row select circuit 34. Main row decoder 42 receives row addresses from external circuitry (not shown) via address bus 50. In one of read and programming operations, main row decoder 42 causes main row select circuit 34 to select one of rows 56–56n in accordance with each row address received.

Column decoder 33 is coupled to columns 57–57n of main memory array 31 and to columns 59–59n of redundant memory array 32. Column decoder 33 receives column addresses from the external circuitry via address bus 60. In one of read and programming operations, column decoder 33 selects one byte of columns 57–57n (i.e., 8 columns) of main memory array 31 and one byte of columns 59–59n (i.e., 8 columns) of redundant memory array 32 for each column address applied. Data is applied to and from either main memory array 31 or redundant memory array 32 via bus 55 and column decoder 33. Bus 55 is then coupled to sense amplifiers and input/output buffers. For the purpose of simplicity, the sense amplifiers and input/output buffers coupled to bus 55 are not shown in FIG. 3.

EPROM 30 further includes a redundant comparison circuit 43. Redundant comparison circuit 43 also receives row addresses from address bus 50. Redundant comparison circuit 43 is coupled to rows 58–58n of redundant memory array 32 via redundant row select circuit 35. Redundant row select circuit 35 is activated by comparison circuit 43 via bus 52. When activated, redundant row select circuit 35 selects one of rows 58–58n based on the row address received and decoded by comparison circuit 43.

EPROM 30 includes a storage circuit 41 and a static row decoder 40. Storage circuit 41 is used in EPROM 30 to store the row addresses of the defective rows of main memory array 31. Storage circuit 41 includes a number of memory locations, each for storing the row address of a defective row of main memory array 31. Each of the memory locations of storage circuit 41 includes nonvolatile memory cells for storing the address of a defective row. Storage circuit 41 is connected to static row decoder 40 and comparison circuit 43 via bus 51.

In one embodiment, storage circuit 41 includes flash EPROM cells for storing the row addresses of the defective rows of main memory array 31. In another embodiment, storage circuit 41 includes PROM cells for storing the row addresses of the defective rows of main memory array 31. In alternative embodiments, storage circuit 41 may be comprised of other types of memory cells. For example, storage circuit 41 may include ROM cells or fuse elements.

As described above, static row decoder 40 receives the row addresses of the defective rows of main memory array 31 via bus 51. Static row decoder 40 is coupled to main row select circuit 34 via bus 45. Static row decoder 40 decodes the row addresses from storage circuit 41 and then controls main row select circuit 34 to disable the access to the respective defective rows of rows 56–56n from main row decoder 42. Because storage circuit 41 pre-stores the row addresses of the defective rows of main memory array 31, static row decoder 40 statically (i.e., constantly) decodes the row addresses of the defective rows whenever EPROM 30 is powered on. This in turn causes the access to the respective defective rows of rows 56–56n of main memory array 31 to be constantly (i.e., statically) disabled once EPROM 30 is powered on. The circuit of main row select circuit 34 and the function of statically disabling the defective rows of main memory array 31 will be described in more detail below, in conjunction with FIG. 4.

Static row decoder 40 includes a number of decoders, each being connected to receive a row address from one memory location of storage circuit 41 via bus 51. For example, when storage circuit 41 includes sixteen (16) memory locations, static row decoder 40 will have sixteen decoders, each for one of the sixteen memory locations of storage circuit 41. If one of the memory locations of storage circuit 41 stores a row address of one defective row of main memory array 31, its associated decoder of static row decoder 40 will decode the row address stored in the associative memory location of storage circuit 41 and generate a disable signal to main row select circuit 34 via one line of bus 45. As a further example, when each of the sixteen memory locations of storage circuit 41 stores a row address for a defective row of main memory array 31, static row decoder 40 will statically decode all the sixteen row addresses stored in storage circuit 41 in parallel and generate sixteen disable signals to main row select circuit 34 via the corresponding sixteen lines of bus 45. When main row select circuit 34 receives the disable signals, main row select circuit 34 will disable the respective defective rows of rows 56–56n from being accessed by main row decoder 42. Alternatively, static row decoder 40 includes more decoders than the number of memory locations of storage circuit 41. For example, static row decoder 40 may include two decoders for each memory location of storage circuit 41.

Redundant comparison circuit 43 is coupled to storage circuit 41 via bus 51. Comparison circuit 43 also receives the external row addresses applied to EPROM 30 via bus 50. The function of redundant comparison circuit 43 is to compare each of the external row addresses applied with the row addresses of the defective rows of main memory array 31 stored in storage circuit 41. If there is a match (i.e., the external row address is the same as one of the pre-stored row addresses), redundant comparison circuit 43 activates the access to a redundant row of redundant memory array 32 in accordance with the external row address applied. Redundant comparison circuit 43 does this by generating an enable signal to redundant row select circuit 35 via bus 52. If there is no match between the external row address applied and the row addresses stored in storage circuit 41, redundant comparison circuit 43 does not allow redundant row select circuit 35 to select a redundant row of redundant memory array 32. In other words, redundant comparison circuit 43 controls the access to redundant memory array 32. When the current external row address applied to EPROM 30 via bus 50 matches one of the row addresses stored in storage circuit 41, redundant comparison circuit 43 enables redundant row select circuit 35 to select one of rows 58–58n. Redundant comparison circuit 43, however, does not control disabling the access to the defective rows of main memory array 31.

Figure 5:
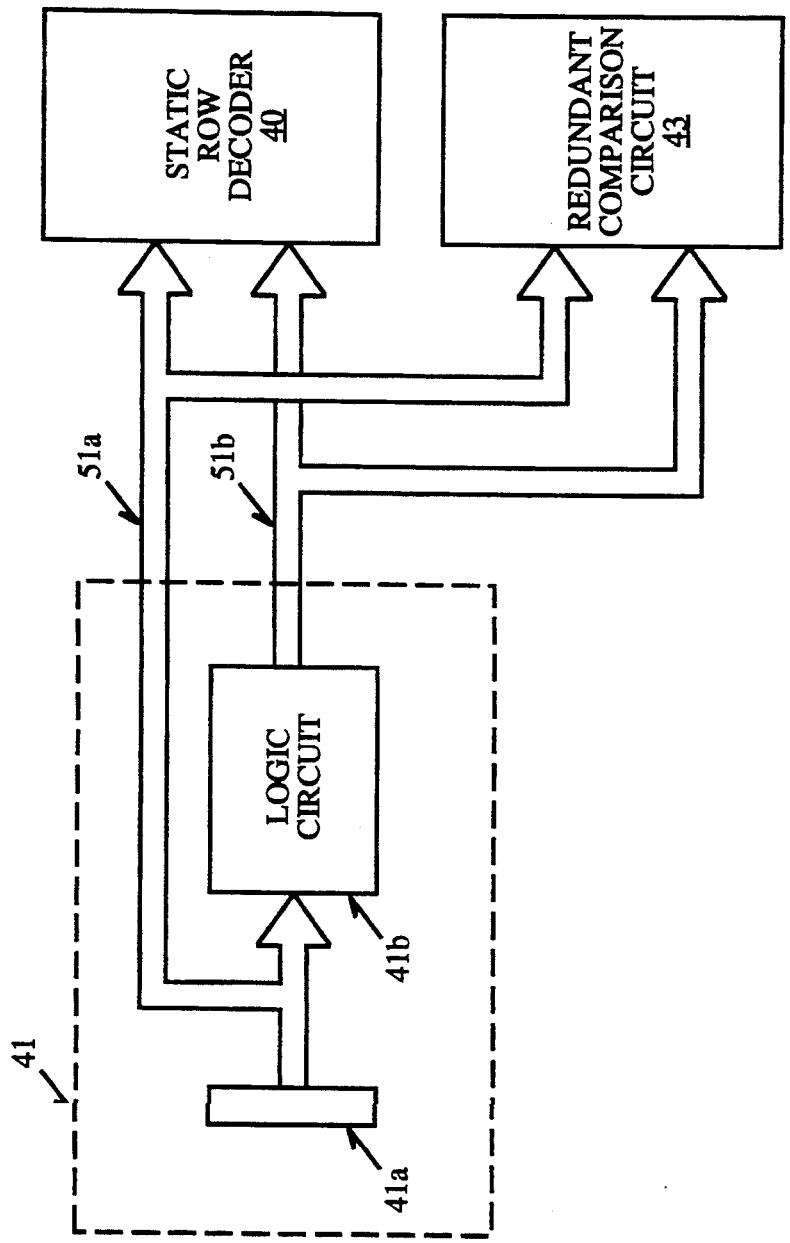
FIG. 5 is a block diagram of the storage circuit of FIG. 3 which implements another embodiment of the present invention.

FIG. 5 illustrates another embodiment of the present invention in which storage circuit 41 includes storage elements 41a for storing the addresses of the defective rows and a logic circuit 41b for generating the addresses adjacent to each of the addresses stored in storage elements 41a. In this embodiment, more than one address can be generated when the defective rows are consecutive and only one of the addresses of the consecutive defective rows needs to be stored in storage elements 41a of storage circuit 41, thus saving storage space for storage circuit 41.

In one embodiment, logic circuit 41b generates a succeeding address for every address stored in storage elements 41a. In this embodiment, logic circuit 41b includes an adder. In another embodiment, logic circuit 41b generates a number of successive addresses for every address stored in storage elements 41a.

The embodiment of storage circuit 41 of FIG. 5 is used to replace a set of consecutive defective memory rows as a common memory failure is a row short-together or a column short-together. This embodiment reduces die size and the test time to program and verify the second address.

Referring back to FIG. 3, the redundancy access is activated before EPROM 30 is shipped to users. A series of tests are conducted to determine whether EPROM 30 meets its device specifications. The series of tests include the determination of defective rows in main memory array 31. When a defective cell or cells are found along a row in main memory array 31, that row (i.e., defective row) is replaced with a redundant row of memory cells of redundant memory array 32. This is done by pre-storing the row address of the defective row found in main memory array 31 in storage circuit 41.

When EPROM 30 is powered on, storage circuit 41 supplies all the row addresses stored in storage circuit 41 to static row decoder 40. Because storage circuit 41 employs nonvolatile memory circuits to store the row addresses of the defective rows of main memory array 31, the row addresses of the defective rows are not lost when EPROM 30 is powered off.

Static row decoder 40 statically decodes all the row addresses stored in storage circuit 41 once EPROM 30 is powered on, and statically supplies the disable signals to main row select circuit 34 via bus 45. This in turn causes main row select circuit 34 to statically disable the access to the respective defective rows of rows 56–56n of main memory array 31 as soon as EPROM 30 is turned on. Static row decoder 40, however, does not cause main row select circuit 34 to disable the access to the respective rows of rows 56–56n of main memory array 31 that are not defective. In other words, static row decoder 40 only causes the access to the defective rows of main memory array 31 to be disabled when EPROM 30 is powered on.

By doing this, main row select circuit 34 does not need to be disabled every time a defective row is addressed. As is known, dynamically disabling the whole circuit of main row select circuit 34 whenever a defective row of main memory array 31 is addressed would delay the access to the associative redundant row of redundant memory array 32. Since the access to the defective rows of main memory array 31 is constantly and statically disabled as soon as EPROM 30 is powered on, the generation of the disable signal to disable the access to main memory array 31 is not needed whenever a defective row is addressed. This thus causes the access to redundant memory array 32 to be as fast as the access to main memory array 31. This means that when redundant comparison circuit 43 determines that the current access is to a redundant row in redundant memory array 32 and generates the enable signal to activate redundant row select circuit 35, the corresponding defective row has already been disabled from being accessed by static row decoder 40.

It, therefore, can be said that no speed penalty is introduced to the access to redundant memory array 32 and the redundant access is as fast as the access to the main memory array. In addition, EPROM 30 is fabricated in a cost effective manner.

The access to redundant memory array 32 is described as follows. When an external row address is applied to bus 50, redundant companion circuit 43 receives the external row address.

Redundant comparison circuit 43 determines if the external row address is directed to a defective row of main memory array 31 by comparing the external row address with all the row addresses stored and generated in storage circuit 41. If there is a match, comparison circuit 43 generates an enable signal to enable redundant row select circuit 35 via bus 52 to select one of rows 58-58n. At this time, static row decoder 40 has already caused main row select circuit 34 to disable the access to the defective row for that external row address.

If there is not a match, redundant comparison circuit 43 then does not generate the enable signal and redundant row select circuit 35 is blocked from selecting one of rows 58-58n.

Figure 4:
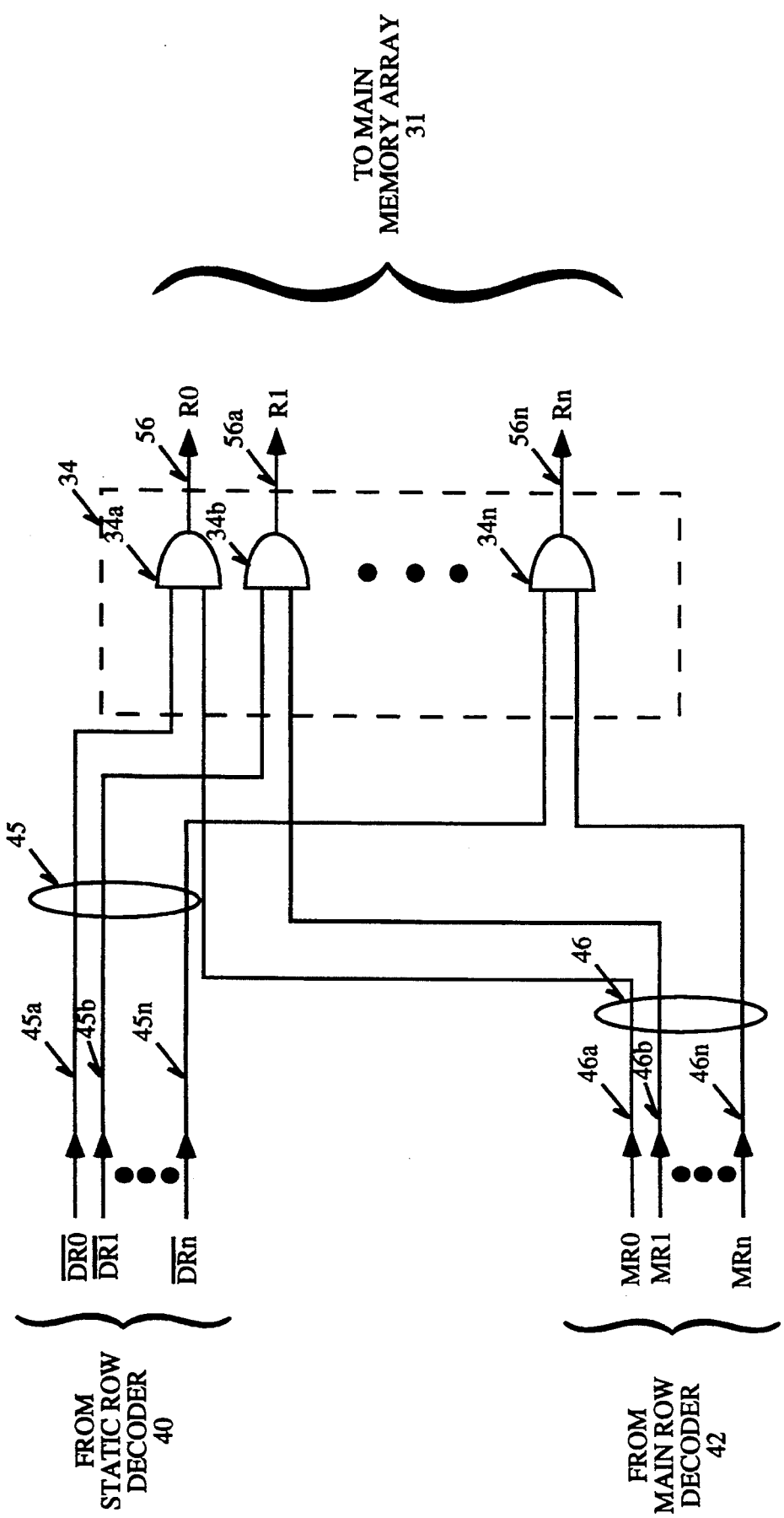
FIG. 4 is a circuit diagram of the main row select circuit for the EPROM of FIG. 3.

Referring to FIG. 4, the circuit of main row select circuit 34 is described. Main row select circuit 34 includes a number of AND gates 34a through 34n, each being connected to, at its output end, one of rows 56-56n of main memory array 31. Each of AND gates 34a-34n has one of its two inputs coupled to one of lines 46a through 46n of bus 46. The number of lines 46a-46n is equal to the number of AND gates 34a-34n of main row select circuit 34. Each of lines 46a-46n provides one of select signals MR0 through MRn to its associated one of AND gates 34a-34n.

The other input of each of AND gates 34a-34n is coupled to one of lines 45a through 45n of bus 45. The number of lines 45a-45n is equal to the number of AND gates 34a-34n of main row select circuit 34. Each of lines 45a-45n can apply one of a number of disable signals $\overline{DR0}$ through $\overline{DRn}$ to its associative one of AND gates $34a \geq 34n$. The disable signals $\overline{DR0}$-$\overline{DRn}$ are generated by static row decoder 40 of FIG. 3 and are active low signals. As described above, static row decoder 40 statically receives the row addresses of the defective rows of main memory array 31 when EPROM 30 is powered on. Static row decoder 40 then statically decodes these row addresses stored and statically generates respective ones of the disable signals $\overline{DR0}$-$\overline{DRn}$ to main row select circuit 34 via the respective ones of lines 45a-45n. For example, when main memory array 31 has its row 56 found defective, the row address of row 56 is then pre-stored in storage circuit 41. When EPROM 30 is powered on, static row decoder 40 receives the row address of row 56 and statically decodes that row address. Static row decoder 40 then statically generates the disable signal $\overline{DR0}$ to AND gate 34a via line 45a of bus 45. The output of AND gate 34a of main row select circuit 34 is coupled to row 56. When the disable signal DR0 is applied to AND gate 34a, AND gate 34a is blocked from selecting row 56 based on the respective select signal MR0 from main row decoder 42 via line 46a and the R0 signal on row 56 will be maintained logically inactive as long as the $\overline{DR0}$ signal is asserted to AND gate 34a. By doing this, row 56 is statically disabled from main row decoder 42.

Meanwhile, other AND gate 34b through 34n of main row select circuit 34 are not affected by the active $\overline{DR0}$ signal. Main row decoder 42 of FIG. 3 can still cause each of AND gates 34b-34n to select its respective one of rows 56a-56n as long as each of the $\overline{R1}$-Rn disable signals is not active.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory, comprising:
    (A) a main memory array having a plurality of memory locations;
    (B) a main select circuit coupled to the main memory array for decoding an address received from an external circuit to access a selected one of the plurality of memory locations;
    (C) a redundant memory array having a plurality of redundant memory locations;
    (D) a storage circuit for pre-storing the address of the selected one of the plurality of memory locations when the selected one of the plurality of memory locations is defective;
    (E) a redundant comparison circuit coupled to the redundant memory array and the storage circuit for comparing the address received from the external circuit with the address pre-stored in the storage circuit in order to access a selected one of the plurality of redundant memory locations;
    (F) a static decoding circuit coupled to the storage circuit and the main select circuit for decoding the address received from the storage circuit and for statically disabling the main select circuit from accessing the selected one of the plurality of memory locations such that when the redundant comparison circuit accesses the selected one of the plurality of redundant memory locations, the main select circuit has already been disabled from accessing the selected one of the plurality of memory locations, wherein the static decoding circuit decodes the address from the storage circuit to disable the main select circuit from accessing only the selected one of the plurality of memory locations based on the address pre-stored in the storage circuit, wherein when the static decoding circuit disables the main select circuit from accessing the selected one of the plurality of memory locations, the main select circuit can still access other ones of the plurality of memory locations that are not defective.

2. The memory of claim 1, wherein the static decoding circuit only disables the access to the selected one of the plurality of memory locations, wherein the main select circuit further comprises a decoder coupled to receive the address from the external circuit and a main select circuit coupled to the decoder for selecting the selected one of the plurality of memory locations for the address.

3. The memory of claim 2, wherein the select circuit further comprises an AND gate.

4. The memory of claim 1 wherein the storage circuit includes electrically erasable and programmable read only memory cells.

5. The memory of claim 1 wherein the memory is a read only memory.

6. The memory of claim 1 wherein the memory is an electrically programmable read only memory.

7. The memory of claim 1 wherein the memory is an electrically erasable and programmable read only memory.

8. The memory of claim 1 wherein the memory is a random access memory.

9. The memory of claim 1 wherein the storage circuit further comprises a storage location for storing the address and a logic circuit for generating an adjacent address of the address stored in the storage location.

10. A memory, comprising:

(A) a main memory array having a plurality of memory locations;

(B) a main select circuit coupled to the main memory array for decoding an address received from an external circuit to access a selected one of the plurality of memory locations;

(C) a redundant memory array having a plurality of redundant memory locations;

(D) a storage circuit for pre-storing the address of the selected one of the plurality of memory locations when the selected one of the plurality of memory locations is defective:

(E) a redundant comparison circuit coupled to the redundant memory array and the storage circuit for comparing the address received from the external circuit with the address pre-stored in the storage circuit in order to access a selected one of the plurality of redundant memory locations;

(F) a static decoding circuit couched to the storage circuit and the main select circuit for decoding the address received from the storage circuit and for statically disabling the main select circuit from accessing the selected one of the plurality of memory locations such that when the redundant comparison circuit accesses the selected one of the plurality of redundant memory locations, the main select circuit has already been disabled from accessing the selected one of the plurality of memory locations, wherein the static decoding circuit further comprises (i) a decoding circuit coupled to the storage circuit for statically decoding the address received from the storage circuit to generate a control signal, wherein the decoding circuit decodes the address from the storage circuit when the address is stored in the storage circuit;

(ii) a disabling circuit coupled to the main select circuit and the decoding circuit for receiving the control signal from the decoding circuit to statically disable the main select circuit from accessing the selected one of the plurality of memory locations before the redundant comparison circuit decodes the address from the external circuit to select the selected one of the plurality of redundant memory locations, wherein the disabling circuit only disables the main select circuit from accessing the selected one of the plurality of memory locations while the main select circuit can still access other ones of the plurality of memory locations that are not defective.

11. A nonvolatile memory, comprising:

(a) a main memory array having a plurality of memory locations;

(b) a main select circuit coupled to the main memory array for selecting and accessing a selected one of the plurality of memory locations in the main memory array;

(c) a main decoding circuit coupled to the main select circuit for decoding an address received from an external circuit to cause the main select circuit to access the selected one of the plurality of memory locations;

(d) a redundant memory array having a plurality of redundant memory locations;

(e) a redundant select circuit coupled to the redundant memory array for selecting and accessing a selected one of the plurality of redundant memory locations in the redundant memory array;

(f) a storage circuit for pre-storing the address for the selected one of the plurality of memory locations when the selected one of the plurality of memory locations is defective;

(g) a static decoding and disabling circuit coupled to the storage circuit and the main select circuit for decoding the address pre-stored in the storage circuit to disable the main select circuit from accessing the selected one of the plurality of memory locations before the main decoding circuit receives the address from the external circuit, wherein the static decoding and disabling circuit statically disables the main select circuit from accessing the selected one of the plurality of memory locations as soon as the address for the selected one of the plurality of memory locations is stored in the storage circuit, wherein the static decoding and disabling circuit decodes the address from the storage circuit only to disable the main select circuit from accessing the selected one of the plurality of memory locations based on the address pre-stored in the storage circuit, wherein when the static decoding and disabling circuit disables the main select circuit from accessing the selected one of the plurality of memory locations, the main select circuit can still access other ones of the plurality of memory locations that are not defective;

(h) a redundancy comparison circuit coupled to the storage circuit and the redundant select circuit for comparing the address received from the storage circuit with the address from the external circuit and for enabling the redundant select circuit to access the selected one of the plurality of redundant memory locations when the stored address matches the address from the external circuit, wherein when the redundant comparison circuit causes the redundant select circuit to access the selected one of the plurality of redundant memory locations in the redundant memory array, the main select circuit has already been disabled from accessing the selected one of the plurality of memory locations.

12. The nonvolatile memory of claim 11, wherein the storage circuit further comprises electrically erasable and programmable read only memory cells.

13. The nonvolatile memory of claim 11, wherein the nonvolatile memory is an electrically programmable read only memory.

14. The nonvolatile memory of claim 11, wherein the nonvolatile memory is an electrically erasable and programmable read only memory.

15. The nonvolatile memory of claim 11, wherein the main select circuit further comprises an AND gate.

16. The nonvolatile memory of claim 11, wherein the storage circuit further comprises a storage location for storing the address and a logic circuit for generating an adjacent address of the address stored in the storage location.

* * * * *